US009105480B2

(12) United States Patent
Arnold et al.

(10) Patent No.: US 9,105,480 B2
(45) Date of Patent: Aug. 11, 2015

(54) METHODS FOR THE FABRICATION OF GRAPHENE NANORIBBON ARRAYS USING BLOCK COPOLYMER LITHOGRAPHY

(71) Applicant: Wisconsin Alumni Research Foundation, Madison, WI (US)

(72) Inventors: Michael S. Arnold, Middleton, WI (US); Padma Gopalan, Madison, WI (US); Nathaniel S. Safron, Madison, WI (US); Myungwoong Kim, Madison, WI (US); Jonathan Woosun Choi, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 129 days.

(21) Appl. No.: 13/829,078

(22) Filed: Mar. 14, 2013

(65) Prior Publication Data

US 2014/0273361 A1    Sep. 18, 2014

(51) Int. Cl.
*C01B 31/04* (2006.01)
*H01L 21/04* (2006.01)
*H01L 21/3065* (2006.01)
*H01L 21/308* (2006.01)
*H01L 21/3105* (2006.01)
*H01L 21/311* (2006.01)
*B82Y 10/00* (2011.01)

(52) U.S. Cl.
CPC .......... *H01L 21/042* (2013.01); *C01B 31/0484* (2013.01); *H01L 21/3065* (2013.01); *H01L 21/3086* (2013.01); *H01L 21/31058* (2013.01); *H01L 21/31116* (2013.01); *H01L 21/31138* (2013.01); *B82Y 10/00* (2013.01)

(58) Field of Classification Search
CPC    B82Y 30/00; C01B 31/0484; H01L 21/3086; B81C 2201/0149
USPC ......................................... 438/694
See application file for complete search history.

(56) References Cited

U.S. PATENT DOCUMENTS

2011/0201201 A1*  8/2011  Arnold et al. ................. 438/694
2012/0241411 A1*  9/2012  Darling et al. ................. 216/67
2012/0301953 A1*  11/2012  Duan et al. ................. 435/287.9

OTHER PUBLICATIONS

Liang et al., "Transport Characteristics of Multichannel Transistors Made from Densely Aligned Sub-10 nm Half-Pitch Graphene Nanoribbons," ACS Nano, vol. 6, No. 11, Oct. 13, 2012, pp. 9700-9710.*
Liu et al., "Epitaxial Graphene Nanoribbon Array Fabrication Using BCP-Assisted Nanolithography," ACS Nano, vol. 6, No. 8, Jul. 10, 2012, pp. 6786-6792.*
Kim et al., "Fabrication and Characterization of Large-Area, Semiconducting Nanoperforated Grahene Materials," NanoLetters, vol. 10, 2010, pp. 1125-1131.*

(Continued)

Primary Examiner — Steven J Fulk
(74) Attorney, Agent, or Firm — Bell & Manning, LLC

(57) ABSTRACT

Methods of fabricating patterned substrates, including patterned graphene substrates, using etch masks formed from self-assembled block copolymer films are provided. Some embodiments of the methods are based on block copolymer (BCP) lithography in combination with graphoepitaxy. Some embodiments of the methods are based on BCP lithography techniques that utilize hybrid organic/inorganic etch masks derived from BCP templates. Also provided are field effect transistors incorporating graphene nanoribbon arrays as the conducting channel and methods for fabricating such transistors.

16 Claims, 5 Drawing Sheets

(56) References Cited

OTHER PUBLICATIONS

Peng et al., Nanoscopic Patterned Materials with Tunable Dimensions via Atomic Layer Deposition on Block Copolymers, Adv. Mater., vol. 22, Sep. 8, 2010, pp. 5129-5133.*
Chai et al., Using Cylindrical Domains of Block Copolymers To Self-Assemble and Align Metallic Nanowires, ACS Nano, vol. 2, No. 3, Feb. 5, 2008, pp. 489-501.*
Jung et al., "Orientation-Controlled Self-Assembled Nanolithography Using a Polystyrene-Polydimethylsiloxane Block Copolymer," NanoLetters, vol. 7, No. 7, 2007, pp. 2046-2050.*
B. Dumé, Graphene nanoribbon arrays break size record, Published on Aug. 31, 2012 by nanotechweb.org at http://nanotechweb.org/cws/article/tech/50666.
Gopalan et al., Graphoepitaxial Assembly of Symmetric Block Copolymers on Weakly Preferential Substrates, Adv. Mater., vol. 22, Aug. 30, 2010, pp. 4325-4329.
Nealey et al., Directed Assembly of Lamellae-Forming Block Copolymers by Using Chemically and Topographically Patterned Substrates, Adv. Mater., vol. 19, Jan. 26, 2007, pp. 607-611.
Jeong et al., Soft Graphoepitaxy of Block Copolymer Assembly with Disposable Photoresist Confinement, Nano Letters, vol. 9, No. 6, May 7, 2009, pp. 2300-2305.
Chai et al., Assembly of aligned linear metallic patterns on silicon, Nature Nanotechnology, vol. 2, Aug. 3, 2007, pp. 500-506.
Jiao et al., Densely Aligned Graphene Nanoribbons at ~35 nm Pitch, Nano Research, vol. 5, No. 4, Apr. 2012, pp. 292-296.
Peng et al., A Route to Nanoscopic Materials via Sequential Infiltration Synthesis on Block Copolymer Templates, ACS Nano, vol. 5, No. 6, May 5, 2011, pp. 4600-4606.
Liang et al., Transport Characteristics of Multichannel Transistors Made from Densely Aligned Sub-10 nm Half-Pitch Graphene Nanoribbons, ACS Nano, vol. 6, No. 11, Oct. 13, 2012, pp. 9700-9710.
Liu et al., Epitaxial Graphene Nanoribbon Array Fabrication Using BCP-Assisted Nanolithography, ACS Nano, vol. 6, No. 8, Jul. 10, 2012, pp. 6786-6792.
Hoyas et al., Growth and characterization of atomic layer deposited $WC_{0.7}N_{0.3}$ on polymer films, Journal of Applied Physics, vol. 95, No. 1, Jan. 1, 2004, pp. 381-388.
Elam et al., Surface chemistry and film growth during TiN atomic layer deposition using TDMAT and $NH_3$, Thin Solid Films, vol. 436, No. 2, Jul. 31, 2003, pp. 145-156.
Musschoot et al., Atomic layer deposition of titanium nitride from TDMAT precursor, Microelectronic Engineering, vol. 86, Oct. 2, 2008, pp. 72-77.
Nakajima et al., Low-temperature formation of silicon nitride gate dielectrics by atomic-layer deposition, Applied Physics Letters, vol. 79, No. 5, Jul. 30, 2001, pp. 665-667.
Ramanathan et al., Emerging trends in metal-containing block copolymers: synthesis, self-assembly, and nanomanufacturing applications, Journal of Materials Chemistry C, Jan. 21, 2013, pp. 2080-2091.
In et al., Side-Chain-Grafted Random Copolymer Brushes as Neutral Surfaces for Controlling the Orientation of Block Copolymer Microdomains in Thin Films, Langmuir, vol. 22, Aug. 1, 2006, pp. 7855-7860.

* cited by examiner

METHODS FOR THE FABRICATION OF GRAPHENE NANORIBBON ARRAYS USING BLOCK COPOLYMER LITHOGRAPHY

REFERENCE TO GOVERNMENT RIGHTS

This invention was made with government support under 0823760 and 1129802 awarded by the National Institutes of Health. The government has certain rights in the invention.

BACKGROUND

Graphene is of scientific and technical interest because of the extraordinary electronic properties of the two-dimensional material. (Geim, A. K. *Science* 2009, 324, 1530-1534.) Unfortunately, however, despite its electronic properties, the applicability of graphene in many electronic applications has been limited because graphene does not have a technologically significant band gap$>>$kT. (Castro Neto, A. H.; Guinea, F.; Peres, N. M. R.; Novoselov, K. S.; and Geim, A. K. *Rev. Mod. Phys.* 2009, 81, 109-162.) The insufficient band gap limits how strongly the conductance of graphene-based devices can be modulated by extrinsic or field-effect doping—which is a critically important behavior for semiconductor applications.

To address this problem, it has been shown that quantum confinement effects can be used to open up a band gap in graphene. For example, it has been demonstrated that the band gap of graphene nanoribbons, $E_g$, patterned using electron-beam lithography, roughly varies inversely with the width of the nanoribbons, w, according to $E_g \sim 0.2$-$1.5$ eV-nm/w. (Castro Neto, A. H.; Guinea, F.; Peres, N. M. R.; Novoselov, K. S.; Geim, A. K. *Rev. Mod. Phys.* 2009, 81, 109-162; Stampfer, C.; Gutttinger, J.; Hellmueller, S.; Molitor, F.; Ensslin, K.; Ihn, T. *Phys. Rev. Lett.* 2009, 102, 056403; Yang, L.; and Park, C. H.; Son, Y. W.; Cohen, M. L.; Louie, S. G. *Phys. Rev. Lett.* 2007, 99, 186801.) Semiconducting graphene nanoribbons also have been fabricated by "unrolling" or "unzipping" carbon nanotubes.

Unfortunately, semiconducting graphene nanoribbons fabricated using e-beam lithography or by unrolling or unzipping carbon nanotubes have faced challenges in scalability and implementation.

SUMMARY

Methods of fabricating patterned substrates, including graphene nanoribbon arrays, are provided. The methods utilize BCP graphoepitaxy, BCP-derived hard masks, or a combination thereof. Also provided are field effect transistors incorporating graphene nanoribbon arrays as the conducting channel and methods for fabricating such transistors.

One embodiment of a method of fabricating a graphene nanoribbon array comprises the steps of: forming a graphoepitaxy channel over a graphene substrate, the channel comprising side walls and a floor; depositing a layer of a surface-modifying copolymer on the side walls and the floor of the channel; depositing a block copolymer in the channel and subjecting the block copolymer to conditions under which spatial confinement of the block copolymer by the channel induces the block copolymer to self-assemble into either a plurality of lamellar domains in which the lamellae are oriented perpendicular with respect to the graphene substrate surface and perpendicular with respect to the channel side walls or into a plurality of cylindrical domains in which the cylinders are oriented parallel with respect to the graphene substrate surface and perpendicular with respect to the channel side walls, such that the self-assembled block copolymer layer defines a striped pattern over the graphene substrate; and transferring the striped pattern into the graphene substrate to provide the graphene nanoribbon array. Once the graphene nanoribbon array is formed, the overlying copolymer layers can be removed In some embodiments of the methods, the graphene nanoribbon arrays are fabricated in an FET device architecture. In one such embodiment, the graphene substrate is initially disposed on a support substrate comprising a gate dielectric overlying a gate electrode. In this embodiment, the graphoepitaxy channel is defined by a source electrode and a drain electrode that are separated by a gap and disposed on the graphene substrate, such that the inner side edges of the source and drain electrodes provide the graphoepitaxy channel side walls and the surface of the graphene substrate exposed between the electrodes provides the graphoepitaxy channel floor. In this embodiment of the methods, after the graphene nanoribbon array is formed in the graphene substrate and the surface-modifying copolymer and the block copolymer are subsequently removed, a field effect transistor is formed in which the graphene nanoribbon array provides the conducting channel region.

Another method of fabricating a patterned substrate comprises: depositing a block copolymer over the substrate and subjecting the block copolymer to conditions that induce it to self-assemble into a plurality of polymeric domains, such that the domains define a pattern over the substrate. Polymeric domains within the self-assembled block copolymer are then converted into inorganic domains comprising inorganic materials, such that the inorganic domains define a pattern over the substrate. The resulting pattern is then transferred into the substrate to provide the patterned substrate. As used herein, the term inorganic materials refers to compounds or elemental materials that are composed primarily or entirely of non-carbon elements and that do not include carbon-carbon bonds or carbon chains. Thus, carbides are considered inorganic materials, although they include carbon atoms. Examples of inorganic materials into which the polymeric domains may be converting include elemental metals and metal and semiconductor element-containing compounds, including oxides, nitrides, fluorides, Group II-VI compounds and Group III-V compounds. The inorganic materials include dielectric materials, electrically conducting materials and semiconducting materials.

In some embodiments of this method, the inorganic domains comprise a metal- or semiconductor-containing inorganic compound and the step of converting polymeric domains into inorganic domains comprises exposing the self-assembled block copolymer to metal- or semiconductor-element containing precursor molecules that coordinate selectively with a set of the polymeric domains to form initiating sites for an atomic layer deposition process; and sequentially exposing the self-assembled block copolymer to alternating first and second gaseous inorganic compound precursor molecules in an atomic layer deposition process, whereby metal- or semiconductor-element containing inorganic domains are grown from the selectively coordinated polymeric domains. In these embodiments, the set of polymeric domains to be converted can be selectively coordinated with precursor-coordinating molecules prior to exposing them to the metal- or semiconductor-element containing precursor molecules. The precursor-coordinating molecules are characterized in that they increase the domains' selectivity for the metal- or semiconductor-element containing precursor molecules.

In other embodiments of the method, the polymeric domains to be converted into inorganic domains comprises a siloxane-containing polymer block and the inorganic domains into which they are converted comprise silica. In such embodiments of the method, the step of converting the siloxane-containing domains into silica domains comprises exposing the self-assembled block copolymer to an oxygen plasma under conditions whereby the siloxane domains are oxidized to form silicon oxide domains.

In yet another embodiment of the method, the inorganic domains comprise a metal and the step of converting the polymeric domains into metal domains comprises selectively protonating a set of the polymeric domains; exposing the protonated polymeric domains to a solution comprising a metal salt, wherein the protonated polymeric domains become loaded with the metal salt via electrostatic interactions between the protonated polymeric domains and the anions of the salt; and then exposing the metal salt-loaded domains to an oxidizing plasma, whereby a metal is formed from the metal salt.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
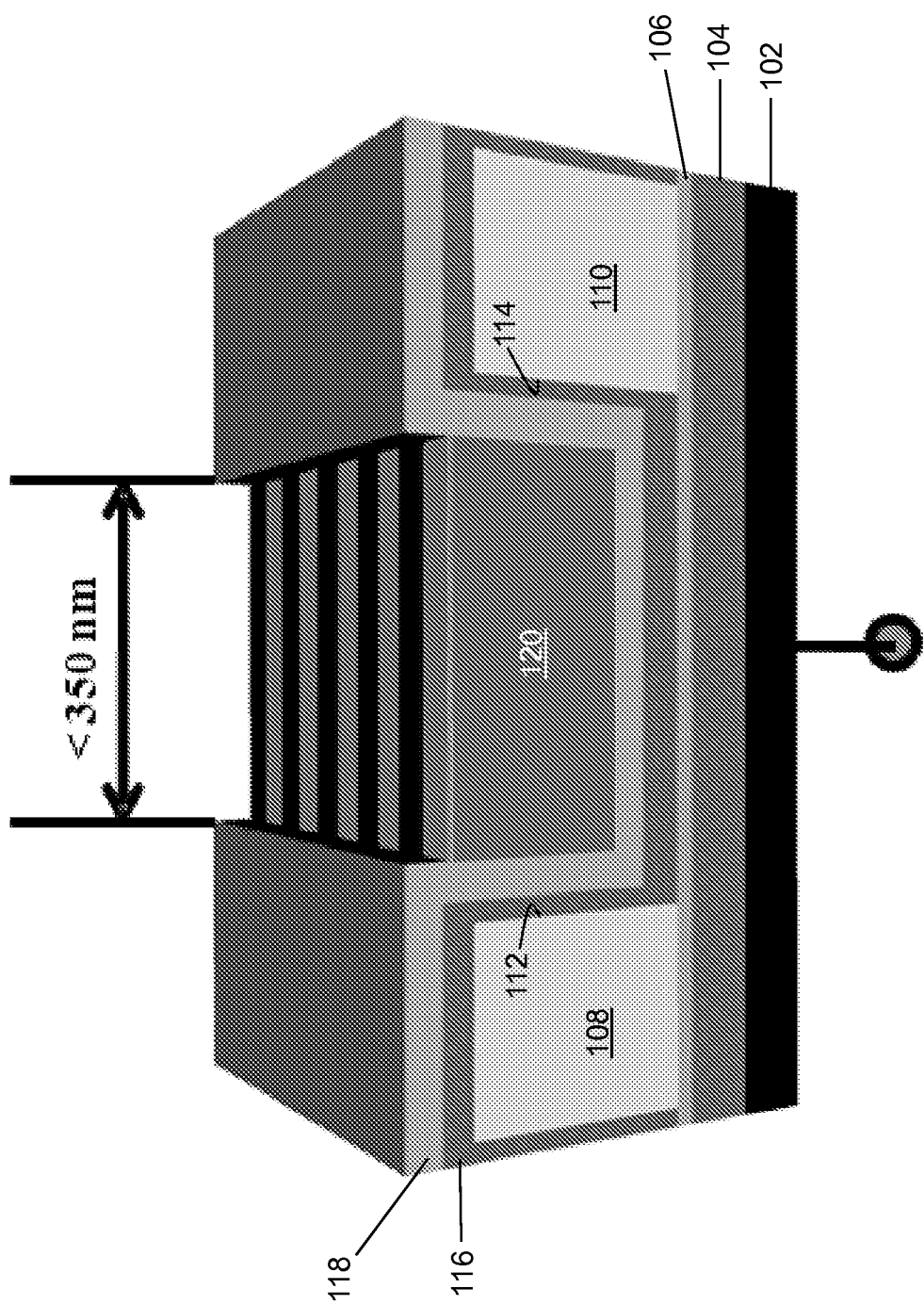
FIG. 1: Schematic depicting the fabrication of GNRs using block copolymer lithography in combination with graphoepitaxy.

Methods of fabricating patterned substrates, including patterned graphene substrates, using etch masks formed from self-assembled block copolymer films are provided. Some embodiments of the methods are based on block copolymer (BCP) lithography in combination with graphoepitaxy. Some embodiments of the methods are based on BCP lithography techniques that utilize hybrid organic/inorganic etch masks derived from BCP templates. Also provided are field effect transistors incorporating graphene nanoribbon arrays as the conducting channel and methods for fabricating such transistors.

The present methods can simultaneously achieve both excellent resolution and scalability. Graphoepitaxy of BCPs uses a topographically patterned, chemically modified substrate where spatial confinement of a BCP induces the nucleation and propagation of ordered domains within the BCP. The alignment of the BCP in graphoepitaxy is driven both locally and globally by the nucleation of domains from confining surfaces of submicron-scale substrate surface features. The fabrication methods can be facilely scaled to batch-process multiple, large-area graphene substrates in parallel while achieving the high-fidelity patterning of exceptionally small nanoribbon features.

In the present methods the surface topography comprises one or more graphoepitaxy channels, each comprising two side walls running in a parallel direction and separated by a submicron-scale gap. A floor of the channel spans the gap at the base of the two side walls. In the present methods, BCP domains nucleate from the side walls leading to domain alignment. Alignment of the channels to the underlying crystallographic directions of the graphene (e.g. armchair or zigzag) is possible on graphene grown on certain substrates, such as single crystalline Cu or SiC substrates.

As used herein, the terms "parallel to" and "perpendicular to" do not indicate a perfectly parallel or perpendicular orientation. Rather, because the various layers and materials described herein may deviate from a perfectly parallel or perpendicular orientation and surfaces may deviate from perfectly planar due to such factors as imperfections in processing techniques, the terms "parallel to" and "perpendicular to" also encompass orientations that are substantially parallel or substantially perpendicular. Thus, for example, the lamellar BCP domains in FIG. 2 and those graphene nanoribbons that span the gap between the two electrodes in FIG. 3 are considered to have a substantially parallel orientation with respect to each other and a substantially perpendicular orientation with respect to the electrodes.

In some embodiments, the methods comprise the steps of: forming a graphoepitaxy channel over graphene, the channel comprising side walls and a floor, as described above; depositing a layer of a surface-modifying copolymer on the side walls and the floor of the channel; depositing a block copolymer layer in the channel, whereby spatial confinement of the block copolymer within the channel induces the block copolymer to self-assemble into either a plurality of lamellar domains oriented perpendicular with respect to the graphene surface and perpendicular with respect to the channel walls or a plurality of cylindrical domains oriented parallel with respect to the graphene surface and perpendicular with respect to the channel walls, such that the self-assembled block copolymer layer defines a striped pattern; and transferring the striped pattern into the graphene to provide the graphene nanoribbon array. As used herein, the term "graphene nanoribbon array" refers to a plurality of strips (lines) of graphene that are aligned along their longitudinal axes and that have width dimensions of no greater than about 1000 nm.

The channel may be formed by depositing strips of material over the graphene surface, wherein the strips are arranged in a parallel orientation and are separated by a gap. In this configuration, the inside edges of the strips provide the channel side walls and the graphene surface exposed within the gap provides the channel floor. Examples of suitable materials for the strips include electrically conductive materials, such as metals.

The surface-modifying copolymer provides the chemical modification that, in combination with the spatial confinement provided by the channel topography, induces the nucleation and propagation of BCP domains from the channel side walls. The surface-modifying copolymer can be selected to induce the formation of lamellar domains or cylindrical domains within the overlying BCP layer. In embodiments wherein lamellar domains are formed, the lamellae are oriented perpendicular with respect to the surface of the underlying graphene and perpendicular with respect to the channel side walls. That is, the lamellar planes are oriented perpendicular to the surface of the underlying graphene and run across—rather than along—the channel. In embodiments wherein cylindrical domains are formed, the cylinders are oriented parallel with respect to the surface of the underlying graphene and perpendicular with respect to the channel side walls. That is, the cylindrical axes (i.e., the axes running through the cylinders, from end to end) are oriented parallel with the surface of the underlying graphene and run across—rather than along—the channel.

The surface-modifying copolymer may be a copolymer polymerized from vinyl monomers and acrylate monomers. The ratios of the monomers that make up the surface-modifying copolymer can vary, depending on the desired characteristics of the final etch mask pattern. Random copolymers of styrene and methylmethacrylate (P(S-r-MMA)) are examples of random copolymers that can be used as a surface-modifying copolymers to induce domain formation in BCPs of styrene and methylmethacrylate (PS-b-PMMA). By varying the ratio of the monomers in the surface-modifying copolymer, it may be designed such that it forms a neutral layer (i.e., exhibiting non-preferential wetting behavior toward the polymer blocks in the overlying BCP) or a preferential layer that exhibits preferential wetting behavior toward a polymer block in the BCP. Thus, a surface-modifying copolymer that provides a neutral layer for the overlying BCP could be used to form perpendicular lamellar domains, while a surface-modifying copolymer that provides a preferential layer could be used to form parallel cylindrical domains.

In some embodiments of the methods, a layer of wetting material is deposited on the channel side walls and floor prior to the deposition of the layer of surface-modifying copolymer. The wetting layer is a thin film of material that serves to improve the wetting of the surface-modifying copolymer on the graphene. The use of this layer is advantageous due to the poor wettability of graphene by certain solvents and polymers that may be used to form the other layers of the structure. In some embodiments, silicon oxide is used as the wetting layer. This wetting layer can be deposited directly onto the graphene material and is typically quite thin. For example, in some embodiments the wetting layer has a thickness about 5 to 20 nm, although thicknesses outside of this range may also be employed. Wetting layers made from self-assembled monolayers (SAMs) can also be used. The molecules making a SAM wetting layer can be organic molecules characterized by a first end that is sufficiently polar to undergo an attractive interaction with an overlying neutral layer. In some embodiments, the first end of the molecules comprises an acid group, such as a carboxyl group. The second end of these molecules are characterized in that they are capable of undergoing an attractive interaction, such as a $\pi$-$\pi$ stacking interaction, with the conjugated rings of the underlying graphene.

Once the surface-modifying copolymer layer has been deposited, the BCP is deposited in the channel and subjected to conditions that induce it to undergo domain formation via the phase segregation of the copolymer into a regular pattern of domains. The step of subjecting the BCP to conditions that induce it to undergo domain formation include subjecting the BCP to a thermal anneal for a time sufficient to allow the BCP to self-assemble into domains or subjecting the BCP to a solvent anneal. During a solvent anneal, the BCP film undergoes swelling as it is exposed to a saturated solvent vapor atmosphere, typically at room temperature (23° C.), for a time sufficient to allow the BCP to self-assemble into domains.

Block copolymers from which the BCP can be formed include block copolymers of vinyl monomers and acrylate monomers. For example, the pattern-defining layer can be formed from a block copolymer of styrene and methylmethacrylate, P(S-b-MMA). The molecular weight of the components that make up the pattern-forming layer polymer can vary, depending on the desired characteristics of the etch mask pattern.

Whether the domains take the form of lamellae or cylinders, they define a striped pattern over the graphene, as viewed along a cross-sectional plane through the BCP layer oriented parallel with respect to the surface of the graphene. The "striped pattern" is characterized by a plurality of alternating, elongated, parallel strips defined in the BCP layer and running between one surface-modified side wall of the channel and the other. The surface-modifying copolymer and the BCP are desirably selected such that their interfacial tension is comparable to, but not equal to, the non-preferential wetting condition, such that the BCP domain orientation depends on, and can be controlled by, BCP film thickness. In such embodiments, homogeneous chemical modification of both the channel side walls and the channel floor can be used to induce the formation of perpendicular lamellar domains in the BCP.

The stripes in the stripe pattern desirably, but not necessarily, have widths of no greater than about 50 nm. This includes embodiments where the stripes have widths of no greater than about 20 nm and further includes embodiments where the stripes have widths of no greater than about 15 nm. For example, in some embodiments, the stripes have widths in the range from 10 nm to about 20 nm. The length of the stripes will depend on the distance between the channel side walls and can be tailored over a wide range. In some embodiments, the length of the stripes is in the range from about 50 nm to about 500 nm, where the length of a stripe is the dimension that runs between the two side walls, perpendicular to the width dimension. However, shorter lengths may also be employed. For example, lengths of no greater than about 10 nm may be desirable in certain applications, such as short channel transistors.

Once the stripe pattern is formed by the BCP layer, it can be used as an etch mask for transferring the pattern into the graphene to provide the graphene nanoribbon array. The etch mask can be formed by selectively removing (e.g., etching) domains in the block copolymer layer to provide a pattern-defining layer and etching the pattern of the pattern-defining layer into the underlying substrate. This pattern transfer can be carried out by an additive or subtractive etching processes and, once the pattern transfer is complete, the BCP, surface-modifying copolymer and any wetting material can be removed. The graphene into which the stripe pattern is transferred may be a single sheet of graphene, a bi-layer of graphene, or may comprise multiple (≥3), stacked graphene sheets. The graphene may be grown or deposited onto a support material.

The graphene nanoribbon array is characterized by a stripe pattern that corresponds closely, if not exactly, to the pattern in the BCP. Thus, the graphene nanoribbon array comprises a plurality of aligned, parallel strips ("nanoribbons") of graphene, wherein neighboring strips are spatially separated by a gap. The width of nanoribbons can be controlled with appropriate choices of the block copolymer, etching method and etching time. In addition, the edges of graphene nanoribbons can be chemically passivated, functionalized, or modified to locally manipulate the electronic or optical properties of the nanoribbons. The nanoribbons in the array desirably, but not necessarily, have widths of no greater than about 50 nm. This includes embodiments where the nanoribbons have widths of no greater than about 20 nm and further includes embodiments where the stripes have widths of no greater than about 15 nm. For example, in some embodiments, the nanoribbons have widths in the range from 5 nm to about 20 nm (e.g., from about 10 to about 18 nm). In some embodiments, the length of the nanoribbons is in the range from about 50 nm to about 500 nm. While in others the lengths may be shorter (e.g., about 10 nm or less).

The graphene nanoribbon arrays may be incorporated as the conducting channel region of a field effect transistor (FET). In some embodiments, the graphene nanoribbon arrays are fabricated in an FET device architecture. This is illustrated in FIG. 1, which is a schematic illustration of an intermediate step in the fabrication of a back-gated FET having a graphene channel region, prior to the formation of the nanoribbon array in the graphene. As shown in the figure, the FET structure includes a bottom gate 102, which may be, for example, a layer of Si(p++); a gate dielectric 104, which may be, for example, silicon oxide, disposed over the bottom gate; one or more sheets of graphene 106 disposed on gate dielectric 104 between a source electrode 108 and a drain electrode 110. In this configuration, the inner side edge 112 of source electrode 108 and the inner side edge 114 of drain electrode 110 provide the side walls of a channel, while the surface of graphene 106 provides the channel floor. The structure further includes a wetting layer 116, which may be, for example, silicon oxide, coating source electrode 108, drain electrode 110 and the surface of graphene 106; a layer of surface-modifying copolymer 118, which may be, for example, P(S-r-MMA) disposed over wetting layer 116; and a layer of BCP 120, which may be, for example, PS-b-PMMA, disposed over surface-modifying copolymer 118 in the channel and nucleated into lamellar domains oriented perpendicular with respect to the surface of graphene 106 and perpendicular with respect to channel side walls 112, 114. Following the assembly of the structure depicted in FIG. 1, the striped pattern defined by BCP 120 can be etched into graphene 106 and wetting layer 116, surface-modifying copolymer 118, and BCP 120 subsequently removed to provide an FET architecture.

The graphene nanoribbon array field effect transistors have applications in nanoelectronics, quantum computing, field effect transistors, thin film flexible electronics, transparent electronics, high electron mobility transistors, microelectromechanical systems, optoelectronics, photodetectors, solar cells, and magnetic, mechanical and chemical sensing.

Another aspect of the present technology provides methods of fabricating patterned arrays in a substrate using hybrid organic/inorganic etch masks derived from self-assembled BCP templates. The etch masks comprise both polymeric and inorganic domains. The use of organic/inorganic hybrid etch masks is advantageous because the polymeric domains and the inorganic domains can have very different etch selectivities and, therefore, are well-suited for the lithographic patterning of very small, well-defined features with a high resolution.

One embodiment of a method of fabricating a patterned substrate comprises the steps of: depositing a block copolymer over the substrate and subjecting the block copolymer to conditions that induce it to self-assemble into a plurality of polymeric domains, such that the domains define a pattern over the substrate; converting polymeric domains in the self-assembled block copolymer into inorganic domains, such that the inorganic domains define a pattern over the substrate; and transferring the pattern of the inorganic oxide domains into the substrate to provide the patterned substrate. For example, the inorganic domains may comprise (or consist essentially of, or consist of) an elemental metal, a metal alloy, a metal oxide, a semiconductor oxide, a metal nitride, a semiconductor nitride, or a metal carbide.

The method may be carried out in combination with graphoepitaxy, whereby a graphoepitaxy channel is formed over the substrate, the block copolymer is formed in the channel and the spatial confinement of the block copolymer by the channel helps to induce domain formation—as discussed in detail above. However, in some embodiments of the method, self-assembly of the block copolymer is carried out without the use of graphoepitaxy. Examples of domains that may be formed via self-assembly of the block copolymer include lamellar domains, wherein the lamellae are oriented perpendicular with respect to the substrate surface; cylindrical domains, wherein the cylinders are oriented parallel with respect to the substrate surface; and cylindrical domains, wherein the cylinders are oriented perpendicular with respect to the substrate surface, and spherical domains. The two former orientations can be used to transfer a striped patterned into the underlying substrate, while the two latter orientations can be used to transfer an array of dots (i.e., holes) into the underlying substrate.

The step of converting the polymeric domains into inorganic domains does not require the complete elimination of the polymeric material in the converted domains. Rather it indicates that the polymeric domains are at least partially replaced by domains comprising a sufficient inorganic material to provide an etch-resistant mask for pattern transfer applications. The replacement may be carried out, for example, by infiltrating the polymeric domains with an inorganic material, growing an inorganic material from the polymer block, or by converting an inorganic-element containing polymer into an inorganic material and then removing any residual polymer block material.

Figure 4:
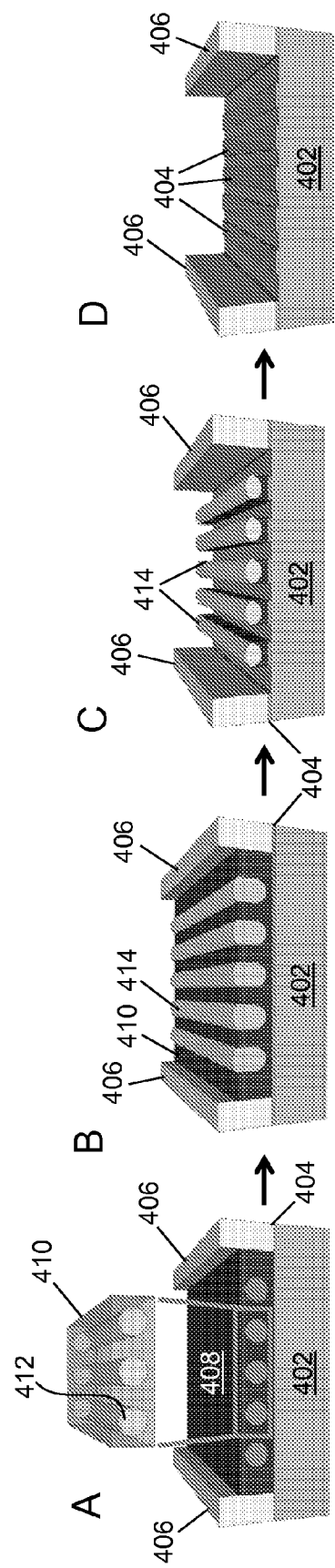
FIG. 4 a schematic illustration of a method of fabricating a patterned substrate using an organic/inorganic etch mask comprising aluminum oxide domains.

FIG. 4 provides a schematic illustration of a method of fabricating a patterned substrate using an organic/inorganic etch mask. This method is further illustrated in Example 2, below. The process begins with a substrate to be patterned 404 (panel (A)). If the substrate is thin, as in the case of a substrate comprising a layer of graphene, an underlying support substrate 402 may also be provided. In the embodiment of the method shown here, two side walls 406 running in a substantially parallel orientation and separated by a gap define the walls of a graphoepitaxy channel into which a BCP 408 is deposited. The BCP is subjected to conditions that induce it to self-assemble into a plurality of domains via phase segregation. For example, in this embodiment, the BCP has self-assembled into a set of cylindrical domains 410 comprising a first polymer block encapsulated by a matrix domain 412 comprising a second polymer block. The cylindrical domains form a striped pattern over substrate 404. By way of illustration, the BCP can be "subjected to conditions that induce it to self-assemble into a plurality of domains" by thermally annealing the BCP for a sufficient period of time (see Example 2), or by subjecting the BCP to a solvent anneal (see, Example 3).

Once the polymeric domains have formed, a set of the polymeric domains is converted into a set of inorganic domains. In the embodiment depicted in FIG. 4, the polymeric cylindrical domains are converted into inorganic domains (panel (B)). The conversion of a domain can be carried out by selectively infiltrating or coordinating the polymer block of that domain with inorganic element-containing precursor molecules and then converting the precursor molecules into metals or inorganic oxides. Next, the remaining BCP material can be selectively removed, leaving the inorganic domains which define a pattern over the substrate. That pattern can then be transferred into the substrate (panel (C)). Finally, any remaining BCP material and the inorganic domains can be removed (panel (D)).

In some embodiments, the polymeric domains are converted into inorganic domains by selectively incorporating inorganic materials into the organic polymeric domains via atomic layer deposition (ALD). ALD is a layer-by-layer deposition technique in which layers are formed by sequential, self-limiting surface reactions of alternating gaseous precursor reactants. Thus, in the present ALD-based domain conversion processes, the conversion of a polymeric domain is carried out by exposing the self-assembled block copolymer to metal-, metalloid-, or non-metal element containing precursor molecules that coordinate selectively with a set of the polymeric domains to form initiating sites for an ALD process. The metal-, metalloid-, or non-metal element-containing precursor molecules can be, for example, organometallic compounds, metal halides or semiconductor halides. Inorganic domains are then grown from the initiating sites by sequentially exposing the self-assembled block copolymer to first and second inorganic element containing precursor molecules in an atomic layer deposition (ALD) process. The resulting inorganic materials may be metallic, semiconducting or electrically insulating. For example, if the inorganic material of the inorganic domain is a metal oxide, the first inorganic-element containing precursor molecules is an oxide-containing molecule, such as $H_2O$, and the second inorganic-element containing precursor molecule is a metal-containing molecule.

Alternatively, if the inorganic material of the inorganic domain is a metal nitride the first inorganic-element containing precursor molecules is a nitride-containing molecule, such as $NH_3$, and the second inorganic-element containing precursor molecule is a metal-containing molecule. Similarly, if the inorganic domain is a semiconductor nitride, the first inorganic-element containing precursor molecule is a nitride-containing molecule, such as $NH_3$, and the second inorganic-element containing precursor molecule is a semiconductor element-containing molecule. Alternatively, if the inorganic domain is a metal carbide, the first inorganic-element containing precursor molecule is a carbon-containing molecule and the second inorganic-element containing precursor molecule is a metal element-containing molecule. The inorganic materials are not limited to compounds comprising only two elements. Rather, inorganic materials, such as metal carbonitrides, having three or more elements can be formed by introducing additional precursor molecules in additional ALD cycles.

Methods for forming inorganic nitrides and carbides are known and can be adapted for use in the present conversion processes. For example, methods for forming tungsten carbonitrides using ALD precursors of hexafluoride ($WF_6$), triethylborane (($C_2H_5)_3B$) and ammonia ($NH_3$) are described in Hoyas et al., *J. Appl. Phys.*, 95, 381-388 (2004). Methods of forming titanium nitride using ALD precursors of $TiCl_4$ (and/or $Ti(N(CH_3)_2)_4$) and $NH_3$ are described in Elam et al., *Thin Solid Films*, 436, 145-156 (2003) and in Musschoot et al., *Microelectronic Engineering*, 86, 72-77 (2008). Methods of forming aluminum nitride (or silicon nitride) using ALD precursors of $Al(CH_3)_3$ (or $SiCl_4$) and $NH_3$ are described in Nakajima et al., 79, 665-667 (2001).

Metal oxides that can be grown from the polymeric domains via ALD include aluminum oxide ($Al_2O_3$), titanium oxide ($TiO_2$), hafnium oxide ($HfO_2$) and tantalum oxide. In one variation of this embodiment, the polymeric domains to be converted are selectively coordinated with precursor-coordinating molecules that increase the domains' selectivity for the metal-containing precursor molecules prior to exposing the self-assembled block copolymer to the metal-containing precursor molecules. For example, the polymeric domains may be coordinated with (e.g., reacted with) coordinating molecules comprising —OH functional groups, such as alcohols or carboxylic acids, than increase the selectivity of the domains for the metal-containing precursor molecules. Example 2 illustrates this method using a copolymer of styrene and vinylpyridine as the block copolymer, hydroquinone as the precursor-coordinating molecule, trimethylaluminum (TMA) as the metal-containing precursor molecule and water as the oxygen-containing precursor molecule. However, other BCPs can be used. For example, a copolymer of styrene and methylmethacrylate can be used as a BCP with $TiCl_4$, $AlCl_3$ or TMA as a metal-containing precursor molecule and water as an oxygen-containing precursor molecule.

The ALD precursors will selectively react with a particular domain of a BCP depending on the chemistries between the two reagents. For example, the metal precursors $Al(CH_3)_3$ and $TiCl_4$, which are Lewis acids, will selectivity react with the carbonyl groups in the PMMA domains of PS-b-PMMA. In addition, PS is considered to be chemically inert to the metal precursors. In addition, one can tune the amount of precursor incorporated in a given BCP domain by tailoring the exposure time and the number of cycles.

In other embodiments, the polymeric domains are converted into metal domains. This conversion can be carried out by selectively protonating a set of the polymeric domains; and exposing the protonated polymeric domains to a solution comprising a metal salt, wherein the protonated polymeric domains become loaded with the metal salt via electrostatic interactions between the protonated polymeric domains and the anions of the salt. The metal salt-loaded domains can then be exposed to an oxidizing plasma (e.g., an $O_2$ plasma), whereby a metal is formed from the metal salt. Metals from which the metal domains can be comprised include gold, platinum, palladium, nickel, copper, cobalt and iron. A description of a method of forming cylindrical metal domains from cylindrical polymeric domains can be found in Chai et al., *ACS Nano*. 2008, 2, 489-501.

Figure 5:
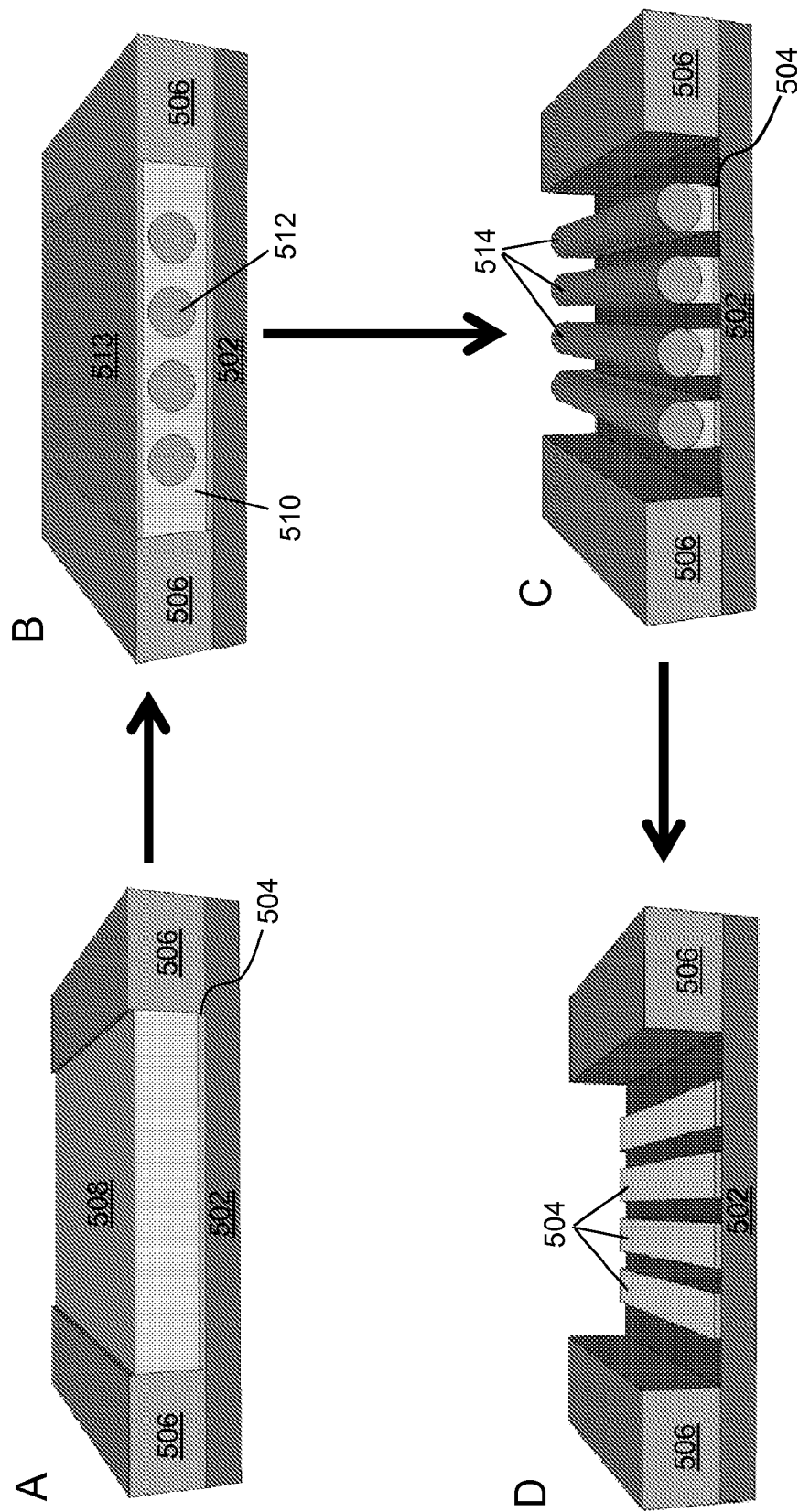
FIG. 5 is a schematic illustration of a method of fabricating a patterned substrate using an organic/inorganic etch mask comprising silica domains.

FIG. 5 provides a schematic illustration of another method of fabricating a patterned substrate using an organic/inorganic etch mask. This method is further illustrated in Example 2, below. In this embodiment one of the polymer blocks in the BCP comprises a polysiloxane, such as polydimethylsiloxane. The process begins with a substrate to be patterned 504 (panel (A)). If the substrate is thin, as in the case of a substrate comprising a layer of graphene, an underlying support substrate 502 may also be provided. In the embodiment of the method shown here, two side walls 506 running in a substantially parallel orientation and separated by a gap define the walls of a graphoepitaxy channel into which a BCP 508 is deposited. The BCP is subjected to conditions that induce it to self-assemble into a plurality of domains (panel (B)). For example, in this embodiment, the BCP has self-assembled into a set of cylindrical domains 510 comprising the polysiloxane polymer block encapsulated by a matrix domain 512 comprising a second polymer block. The cylindrical domains form a striped pattern over substrate 504. It is possible that during the self-assembly a wetting layer 513 comprising the polysiloxane will form on the surface of the BCP film. Once the domains are formed within the BCP, the siloxane-containing domains can be converted into silica domains by exposing the self-assembled block copolymer to an oxygen plasma under conditions whereby the matrix domain is removed and the polysiloxane domains are oxidized to form silicon oxide domains which define a pattern over the substrate (panel (C)). This pattern can then be transferred into substrate 504. (panel (C)). Finally, any remaining BCP material and the silicon oxide domains can be removed (panel (D)).

EXAMPLES

Example 1

This example illustrates the use the present methods to fabricate graphene nanoribbon arrays with sub-20 nm dimensions using a lamella forming PS-b-PMMA BCP. The graphene nanoribbon arrays were fabricated in FET device architectures, as depicted in FIG. 1.

To fabricate the FET devices, graphene was mechanically exfoliated onto 86 nm $SiO_2/Si(p++)$ wafers. Monolayer graphene pieces were identified by optical phase contrast using predetermined correlations of optical contrast with measured spectral shifts of the Raman G' band corresponding to mono-, bi-, and multiple layers of graphene. The degenerately doped Si substrates and the $SiO_2$ were used as the gate electrodes and dielectrics of the FETs, respectively. Four electrodes spaced at 0.3~0.35 μm (thicknesses: 4 nm Cr/26 nm Au/4 nm Ti) contacted the graphene. The top Ti layer prevented sputtering of Au during subsequent etching. After electrode patterning, 10 nm of a silicon oxide wetting layer was deposited on the graphene by e-beam evaporation (220° C. substrate, 50 μtorr $O_2$ backfill) to ensure wetting of the surface-modifying copolymer. Then, 2 wt. % solution of hydroxyl terminated surface-modifying P(S-r-MMA) random copolymer (S: 70%, MMA: 30%) in toluene was spin-coated at 1,000 rpm, and annealed at 200~220° C. for 6 hrs under vacuum. Hydroxyl terminated P(S-r-MMA) random copolymer was synthesized as reported earlier. (P. Mansky, Y. Liu, E. Huang, T. P. Russell, C. Hawker, *Science* 1997, 275, 1458.) The annealed sample was washed with toluene to remove unreacted random copolymers from the silicon oxide layer. Lamellar forming block copolymer, 18k-18k, P(S-b-MMA) solution in toluene (0.7 wt %) was spin-coated at 4,000 rpm onto the random copolymer-covered graphene FET device and annealed at 220° C. under vacuum for 3 hrs, resulting in perpendicular lamellar block copolymer thin film. $O_2$ plasma RIE (50 W, 20 mT, 20 sccm) was utilized to remove PMMA domains and the underlying random copolymer layer to define a striped PS nanoribbon pattern. $CHF_3$ and $O_2$ mixed plasma RIE (300 W, 60 mT, $CHF_3$ 45 sccm and $O_2$ 5 sccm) was then used to etch the oxide wetting layer and the underlying graphene. To control the width of graphene nanoribbons, the final $O_2$ plasma RIE can be performed for various durations.

Figure 2:
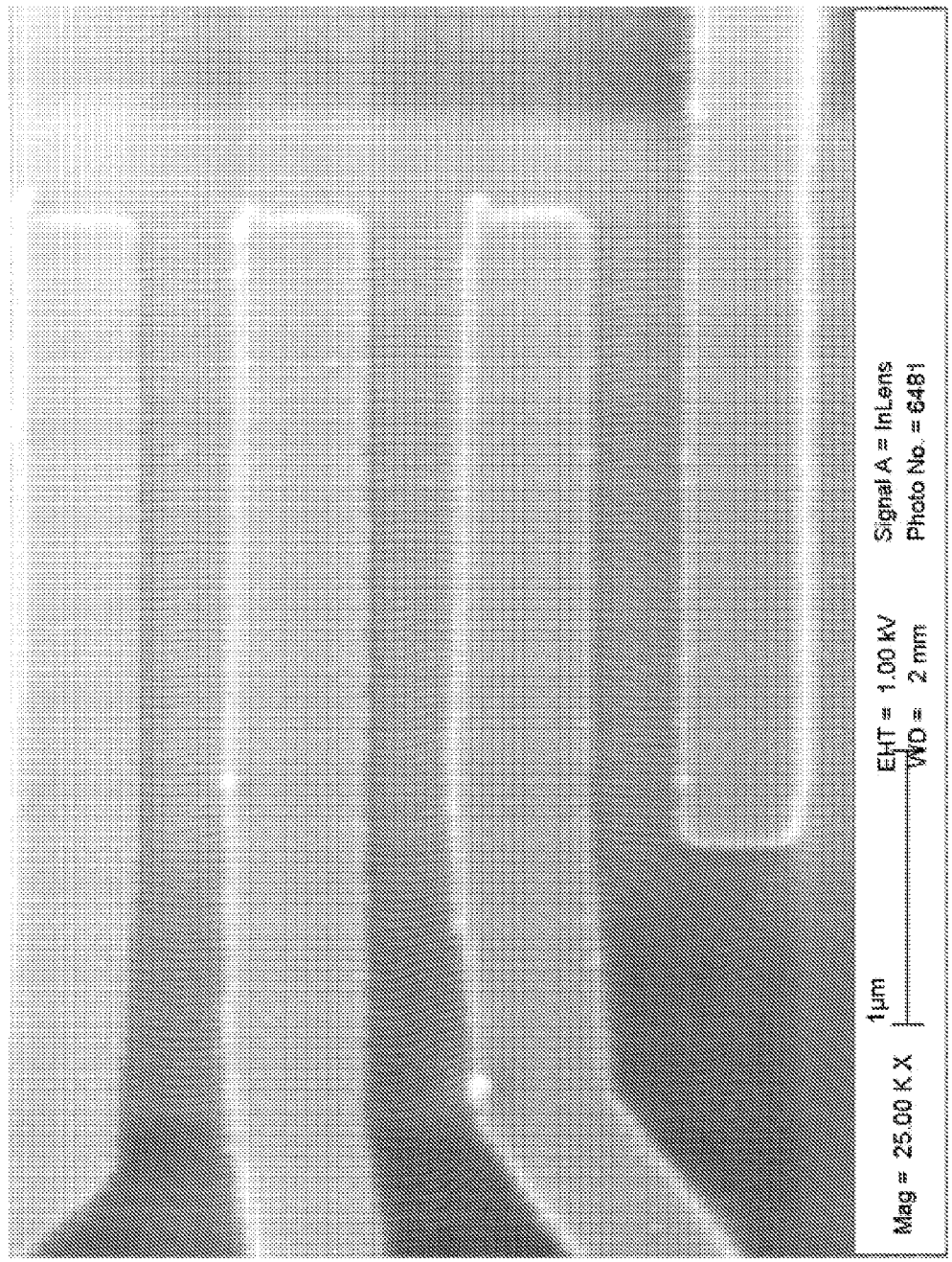
FIG. 2: Scanning electrode microscope (SEM) image of assembled P(S-b-MMA) 18k-b-18k ($L_0$=28 nm) on a random copolymer [P(S-r-MMA) $F_{St}$=0.70] modified oxide surface in an FET device. Underneath the oxide is a monolayer of graphene on the gate electrode, as shown in FIG. 1.
Figure 3:
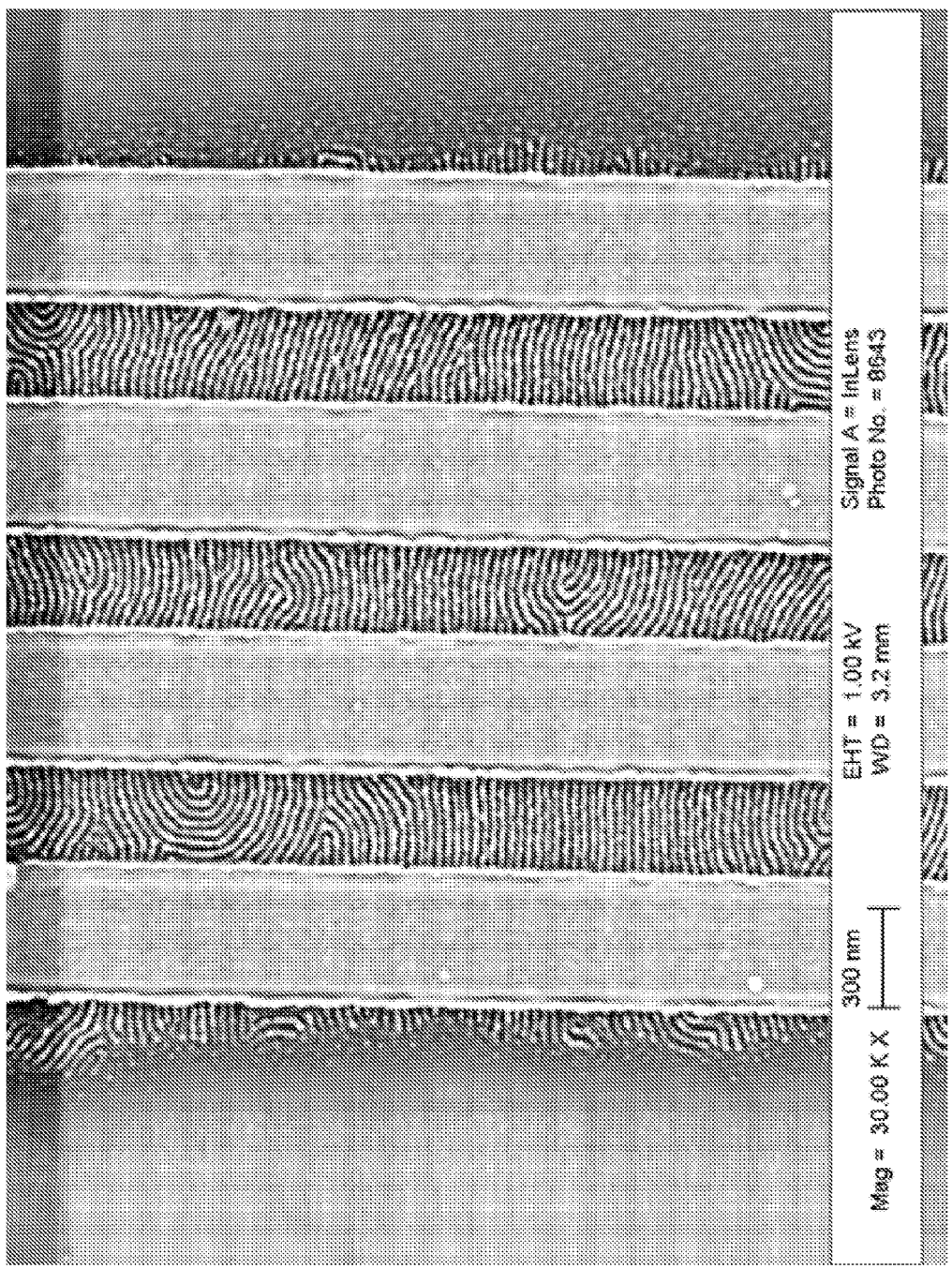
FIG. 3: SEM image of the GNRs resulting from etching the assembled P(S-b-MMA) (shown in FIG. 2), with $O_2$ plasma for 16 sec followed by $CHF_3+O_2$ plasma for 13 sec. The nanoribbon width is ~15 to 18 nm.

An SEM image of the assembled P(S-b-MMA) 18k-b-18k ($L_0$=28 nm) on the random copolymer [P(S-r-MMA) $F_{St}$=0.70] modified oxide surface in the FET device is shown in FIG. 2.

An SEM image of the graphene nanoribbons resulting from etching the assembled P(S-b-MMA) (shown in FIG. 2), with $O_2$ plasma for 16 sec followed by $CHF_3+O_2$ plasma for 13 sec. is shown in FIG. 3. The nanoribbon width was ~15 to 18 nm.

Example 2

This example illustrates the process of converting polymeric domains in a BCP into metal oxide domains by incorporating metal oxides into the poly-2-vinylpyridine (P2VP) cylindrical domains of a PS-b-P2VP block copolymer by means of ALD. The resulting oxide-based cylinders provide a hard etch mask to pattern transfer down to an underlying graphene substrate for the fabrication of sub-10 nm dimension (width) graphene nanoribbons.

The graphene was synthesized by Chemical Vapor Deposition (CVD) onto a copper foil as follows. A copper foil was loaded into a horizontal, 28 mm diameter quartz tube furnace, which was heated to 1050° C. under a 900 sccm flow of forming gas (95% Ar, 5% $H_2$). After annealing for 30 min, 10 ppm of $CH_4$ was introduced into the flow and graphene was allowed to grow for 16 hours, followed by rapid cooling (~10° C./sec until below 700° C.). The synthesized graphene was transferred from the Cu foil by spin-coating PMMA (Microchem, product 950 PMMA 2C) over the exposed graphene surface and backside-etching the copper foil with an aqueous solution of 0.2 M HCl, 0.2 M $FeCl_3$. The resulting floating graphene/PMMA film was washed by floating it on 1:9 HF(49%)/DI water, then floating it on DI water and finally allowing it to dry on a 89 nm $SiO_2/Si(p++)$ wafer. The PMMA film was removed with boiling dichloromethane, and the sample was further washed with isopropyl alcohol.

A 19 nm thick P(S-b-2VP) ($M_n$(PS)=23.6k, $M_n$(2VP)=10.4k, PDI=1.04) BCP (Polymer Source, Inc., Canada) with a P2VP cylinder forming morphology was deposited by spin-coating the BCP in toluene at 4,000 rpm onto CVD grown graphene on 89 nm $SiO_2/Si(p++)$ wafer. The sample was thermally annealed at 190° C. for 24 hours. The annealed BCP films were immersed in a 0.25M solution of hydroquinone (HQ) for 2 hours, where the HQ coordinated with the nitrogen in the 2VP domains increasing the domain's selectivity (i.e., relative to that of the S domain) for the ALD precursor trimethylaluminum (TMA) to form aluminum oxide cylinders, or for titanium tetrachloride to create titanium oxide cylinders. Tartaric acid can also be utilized as a precursor-coordinating molecule in a similar method to increase selectivity to the TMA because of the 4 possible binding sites versus HQ's single site. ALD was performed in a flow reactor with the ALD reactants TMA and DI water. Ultrahigh purity $N_2$ was used as a purge gas and carrier gas. $Al_2O_3$ ALD was performed by alternating exposures of TMA/$H_2O$ at 85° C. with a timing sequence of 0.5/60/0.5/60 sec (TMA/purge/$H_2O$/purge) for 1, 2, 3, and 5 cycles. The samples were then exposed to 8 sec, 50 W, $O_2$ plasma exposing the patterned inorganic material and observed under SEM.

Example 3

This example describes a process of converting polymeric domains in a BCP into silica domains by oxidizing the dimethylsiloxane domains of a PS-b-PDMS block copolymer by means of an $O_2$ plasma. The resulting silica-based cylinders provide a hard etch mask to pattern transfer down to an underlying graphene substrate for the fabrication of sub-10 nm dimension (width) graphene nanoribbons.

The graphene was synthesized by Chemical Vapor Deposition (CVD) onto a copper foil as follows. A copper foil was loaded into a horizontal, 28 mm diameter quartz tube furnace, which was heated to 1050° C. under a 900 sccm flow of forming gas (95% Ar, 5% $H_2$). After annealing for 30 min, 10 ppm of $CH_4$ was introduced into the flow and graphene was allowed to grow for 16 hours, followed by rapid cooling (~10° C./sec until below 700° C.). The synthesized graphene was transferred from the Cu foil by spin-coating PMMA (Microchem, product 950 PMMA 2C) over the exposed graphene surface and backside-etching the copper foil with an aqueous solution of 0.2 M HCl, 0.2 M $FeCl_3$. The resulting floating graphene/PMMA film was washed by floating it on 1:9

HF(49%)/DI water, then floating it on DI water and finally allowing it to dry on a 89 nm $SiO_2/Si(p++)$ wafer. The PMMA film was removed with boiling dichloromethane, and the sample was further washed with isopropyl alcohol.

A 18 nm thick P(S-b-DMS) ($M_n$(PS)=11k, $M_n$(PDMS)=5k, PDI=1.08) BCP (Polymer Source, Inc., Canada) with a PDMS cylinder forming morphology was deposited by spin-coating the BCP in toluene at 4,000 rpm onto the CVD grown graphene on 89 nm $SiO_2/Si(p++)$ wafers with and without graphoepitaxial channels. The thin film underwent solvent annealing in a low vapor pressure acetone chamber at room temperature overnight (see Y. Jung, J. Chang, E. Verploegen, K. Berggren, C. Ross, *Nano Letters*, 2010, 10, 1000-1005). A $CF_4$ and $O_2$ mixed plasma reactive ion etch (RIE) (300 W, 40 mT, $CF_4$ 45 sccm and $O_2$ 5 sccm) was used to etch the PDMS surface layer. Subsequently, an $O_2$ plasma RIE (50 W, 30 mT, 30 sccm) was utilized to etch the PS matrix, oxidizing the PDMS cylinders to provide a hard etch mask composed of silicon oxide for pattern transfer into the graphene. The $O_2$ plasma time was modified to ensure successful pattern transfer to the underlying graphene layer, which was confirmed by the $I_D/I_G$ ratio from Raman spectroscopy. The $I_D/I_G$ ratio with correlating SEM micrographs indicated that the oxidized PDMS was able to act as a hard mask in the fabrication of nanopatterned graphene with 8 nm nanoribbon widths.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of fabricating a graphene nanoribbon array, the method comprising:
    forming a graphoepitaxy channel over a graphene substrate, the channel comprising side walls and a floor;
    depositing a layer of a surface-modifying copolymer on the side walls and the floor of the channel;
    depositing a block copolymer in the channel and subjecting the block copolymer to conditions under which spatial confinement of the block copolymer by the channel induces the block copolymer to self-assemble into a plurality of domains, such that the self-assembled block copolymer layer defines a striped pattern over the graphene substrate, wherein the stripes in the striped pattern are oriented parallel with respect to the graphene substrate surface and perpendicular with respect to the channel side walls; and
    transferring the striped pattern into the graphene substrate to provide the graphene nanoribbon array.

2. The method of claim 1, wherein the surface-modifying copolymer is a random copolymer of styrene and methylmethacrylate, the block copolymer is a block copolymer of styrene and methylmethacrylate and the domains are lamellar domains.

3. The method of claim 1, further comprising depositing a layer of wetting material in the channel prior to depositing the layer of a surface-modifying copolymer.

4. The method of claim 3, wherein the surface-modifying copolymer is a random copolymer of styrene and methylmethacrylate, the block copolymer is a block copolymer of styrene and methylmethacrylate and the wetting material is silicon oxide.

5. The method of claim 3:
    wherein the graphene substrate is disposed on a support substrate comprising a gate dielectric overlying a gate electrode;
    wherein the graphoepitaxy channel is defined by a source electrode and a drain electrode separated by a gap and disposed on the graphene substrate, such that the inner side edges of the source and drain electrodes provide the channel side walls and the surface of the graphene substrate provides the channel floor;
    wherein the layer of wetting material is a layer a silicon oxide; and
    wherein the method further comprises removing the surface-modifying copolymer and the block copolymer after the striped pattern has been transferred into the graphene substrate to form a field effect transistor in which the graphene nanoribbon array provides a conducting channel region.

6. The method of claim 1, wherein the average width of the nanoribbons in the array is no greater than about 20 nm.

7. The method of claim 1, further comprising removing the surface-modifying copolymer and the block copolymer after the striped pattern has been transferred into the graphene substrate.

8. The method of claim 1, wherein the graphene substrate is a single sheet of graphene.

9. The method of claim 1:
    wherein the graphene substrate is disposed on a support substrate comprising a gate dielectric overlying a gate electrode;
    wherein the graphoepitaxy channel is defined by a source electrode and a drain electrode separated by a gap and disposed on the graphene substrate, such that the inner side edges of the source and drain electrodes provide the channel side walls and the surface of the graphene substrate provides the channel floor; and
    wherein the method further comprises removing the surface-modifying copolymer and the block copolymer after the striped pattern has been transferred into the graphene substrate to form a field effect transistor in which the graphene nanoribbon array provides a conducting channel region.

10. The method of claim 1, wherein the plurality of domain are lamellar domains in which lamellae are oriented perpendicular with respect to the graphene substrate surface and perpendicular with respect to the channel side walls.

11. The method of claim 1, wherein the plurality of domains are cylindrical domains in which the cylinders are oriented parallel with respect to the graphene substrate surface and perpendicular with respect to the channel side walls.

12. A method of fabricating a patterned graphene array, the method comprising:
    depositing a block copolymer over a graphene substrate and subjecting the block copolymer to conditions that induce it to self-assemble into a plurality of polymeric domains, such that the domains define a pattern over the graphene substrate;

converting polymeric domains in the self-assembled block copolymer into inorganic domains comprising a metal oxide, such that the inorganic domains define a pattern over the graphene substrate, by exposing the self-assembled block copolymer to metal-containing precursor molecules that coordinate selectively with a set of the polymeric domains to form initiating sites for an atomic layer deposition process and sequentially exposing the self-assembled block copolymer to oxygen-containing precursor molecules and metal-containing precursor molecules in an atomic layer deposition process, whereby metal oxide domains are grown from the selectively coordinated polymeric domains; and transferring the pattern of the inorganic domains into the graphene substrate to provide the patterned graphene array.

13. The method of claim 12, further comprising selectively coordinating the set of polymeric domain with precursor-coordinating molecules that increase the domains' selectivity for the metal-containing precursor molecules prior to exposing the self-assembled block copolymer to the metal-containing precursor molecules.

14. The method of claim 12, wherein the block copolymer is a block copolymer of styrene and vinylpyridine and the polymeric domains comprise cylindrical domains oriented parallel with respect to the graphene substrate surface.

15. A method of fabricating a patterned graphene array, the method comprising:

depositing a block copolymer over a graphene substrate and subjecting the block copolymer to conditions that induce it to self-assemble into a plurality of polymeric domains, such that the domains define a pattern over the graphene substrate;

converting the polymeric domains in the self-assembled block copolymer into metal domains, such that the metal domains define a pattern over the graphene substrate, by selectively protonating a set of the polymeric domains; exposing the protonated polymeric domains to a solution comprising a metal salt, wherein the protonated polymeric domains become loaded with the metal salt via electrostatic interactions between the protonated polymeric domains and the anions of the salt; and exposing the metal salt-loaded domains to an oxidizing plasma, whereby a metal is formed from the metal salt; and transferring the pattern of the metal domains into the graphene substrate to provide the patterned graphene array.

16. The method of claim 15, wherein the block copolymer is a block copolymer of styrene and vinylpyridine and the polymeric domains comprise cylindrical domains oriented parallel with respect to the graphene substrate surface.

* * * * *